United States Patent
Kim et al.

(10) Patent No.: US 10,177,176 B2
(45) Date of Patent: Jan. 8, 2019

(54) THIN FILM TRANSISTOR ARRAY SUBSTRATE AND METHOD FOR MANUFACTURING THE SAME

(71) Applicant: LG DISPLAY CO., LTD., Seoul (KR)

(72) Inventors: Jae-Bum Kim, Gwangmyeong-si (KR); Woo-Yeal Jun, Paju-si (KR); Kyung-Sun Yun, Paju-si (KR); Yu-Ji Ham, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/572,521

(22) Filed: Dec. 16, 2014

(65) Prior Publication Data

US 2015/0187821 A1 Jul. 2, 2015

(30) Foreign Application Priority Data

Dec. 30, 2013 (KR) .................. 10-2013-0166575

(51) Int. Cl.
| | |
|---|---|
| *H01L 27/12* | (2006.01) |
| *G02F 1/1362* | (2006.01) |
| *H01L 27/32* | (2006.01) |
| *G02F 1/1333* | (2006.01) |

(52) U.S. Cl.
CPC ........ *H01L 27/1248* (2013.01); *G02F 1/1362* (2013.01); *H01L 27/124* (2013.01); *H01L 27/1262* (2013.01); *G02F 2001/133388* (2013.01); *G02F 2001/136222* (2013.01); *H01L 27/322* (2013.01)

(58) Field of Classification Search
CPC ...................................................... H01L 27/12
See application file for complete search history.

(56) References Cited

U.S. PATENT DOCUMENTS

| | | | |
|---|---|---|---|
| 2004/0174476 | A1 | 9/2004 | Yeh et al. |
| 2004/0239840 | A1 | 12/2004 | Ikeda et al. |
| 2005/0253984 | A1* | 11/2005 | Kim et al. ............ 349/106 |
| 2008/0239215 | A1* | 10/2008 | Chae .................... 349/107 |

(Continued)

FOREIGN PATENT DOCUMENTS

| | | |
|---|---|---|
| CN | 1677207 A | 10/2005 |
| CN | 100412664 C | 8/2008 |

(Continued)

*Primary Examiner* — Joseph C Nicely
*Assistant Examiner* — Lamont Koo
(74) *Attorney, Agent, or Firm* — Birch, Stewart, Kolasch & Birch, LLP

(57) ABSTRACT

To prevent light leakage and compensate for a step between a display region and a non-display region, a thin film transistor array substrate can include a base substrate having a display region and a non-display region, a plurality of pixel regions defined by gate lines and data lines crossing each other in the display region of the base substrate, a common line corresponding to between adjacent pixel regions, a thin film transistor and a color filter in each pixel region, a first dummy color filter between the adjacent pixel regions, a second dummy color filter in the non-display region on the base substrate, the second dummy color filter being provided at an upper surface thereof with at least one recess, and a protective film over the entire surface of the base substrate to cover the first and second dummy color filters and fill the recess.

16 Claims, 8 Drawing Sheets

(56) References Cited

U.S. PATENT DOCUMENTS

| | | | |
|---|---|---|---|
| 2011/0031517 A1* | 2/2011 | Huang et al. ................... | 257/98 |
| 2013/0155353 A1* | 6/2013 | Ma et al. ....................... | 349/106 |
| 2014/0009728 A1* | 1/2014 | Jang ................... | G02F 1/13394 |
| | | | 349/106 |

FOREIGN PATENT DOCUMENTS

| CN | 101666937 A | 3/2010 |
|---|---|---|
| CN | 102043297 A | 5/2011 |
| KR | 10-2007-0013574 A | 1/2007 |
| WO | WO 2009/055621 A1 | 4/2009 |

\* cited by examiner

THIN FILM TRANSISTOR ARRAY SUBSTRATE AND METHOD FOR MANUFACTURING THE SAME

This application claims the priority benefit of Korean Patent Application No. 10-2013-0166575, filed on Dec. 30, 2013, which is hereby incorporated by reference as if fully set forth herein.

BACKGROUND OF THE INVENTION

Field of the Invention

The present invention relates to a thin film transistor array substrate. More specifically, the present invention relates to a thin film transistor array substrate and a method for manufacturing the same to prevent light leakage and to compensate for a step between a display region and a non-display region.

Discussion of the Related Art

In accordance with the evolution of information-dependent society, demand for display devices has vastly increased. In response to this demand, in recent years, a variety of display devices such as liquid crystal displays (LCDs), plasma display panels (PDPs), electro-luminescent displays (ELDs) and vacuum fluorescent displays (VFDs) are being researched and some thereof are utilized as displays for various devices.

In general, the liquid crystal display device includes a color filter substrate provided with color filters, a thin film transistor array substrate provided with thin film transistors and a liquid crystal cell formed between the color filter substrate and the thin film transistor array substrate. Specifically, in the display region of the thin film transistor array substrate, a plurality of gate lines and a plurality of data lines cross each other to define a plurality of pixel regions and thin film transistors are formed in the respective pixel regions. In addition, color filters formed on the color filter substrate are respectively formed in the pixel regions and light of color corresponding to the color filters are emitted when the thin film transistors are operated.

When a display device is formed by joining the thin film transistor array substrate to the color filter array substrate, light leakage cannot be completely shielded in a non-display region. Accordingly, light leakage is generated in adjacent pixel regions and the non-display region, disadvantageously causing deterioration in display quality.

SUMMARY OF THE INVENTION

Accordingly, the present invention is directed to a thin film transistor array substrate and a method for manufacturing the same that substantially obviate one or more problems due to limitations and disadvantages of the related art.

An object of the present invention is to provide a thin film transistor array substrate and a method for manufacturing the same to prevent light leakage and compensate for a step between a display region and a non-display region.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a thin film transistor array substrate includes a substrate having a display region and a non-display region, a plurality of pixel regions defined by a plurality of gate lines and a plurality of data lines crossing each other in the display region of the substrate, a common line corresponding to between adjacent pixel regions, the common line disposed parallel to the gate line, a thin film transistor and a color filter in each pixel region, a first dummy color filter between the adjacent pixel regions, a second dummy color filter in the non-display region on the substrate, the second dummy color filter being provided at an upper surface thereof with at least one recess and a protective film over the entire surface of the substrate to cover the first and second dummy color filters and fill the recess.

In another aspect of the present invention, provided is a method for manufacturing a thin film transistor array substrate including forming a plurality of gate lines and a plurality of common lines parallel to each other in a display region on a substrate, forming a plurality of data lines crossing the gate lines to define a plurality of pixel regions and, forming a thin film transistor and a color filter in each pixel region, forming a first dummy color filter between adjacent pixel regions, forming a second dummy color filter to have at least one recess at an upper surface in a non-display region on the substrate and forming a protective film over the entire surface of the substrate to cover the first and second dummy color filters and fill the recess.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, a thin film transistor array substrate and a method for manufacturing the same according to the present invention will be described in detail with reference to the annexed drawings.

Figure 1:
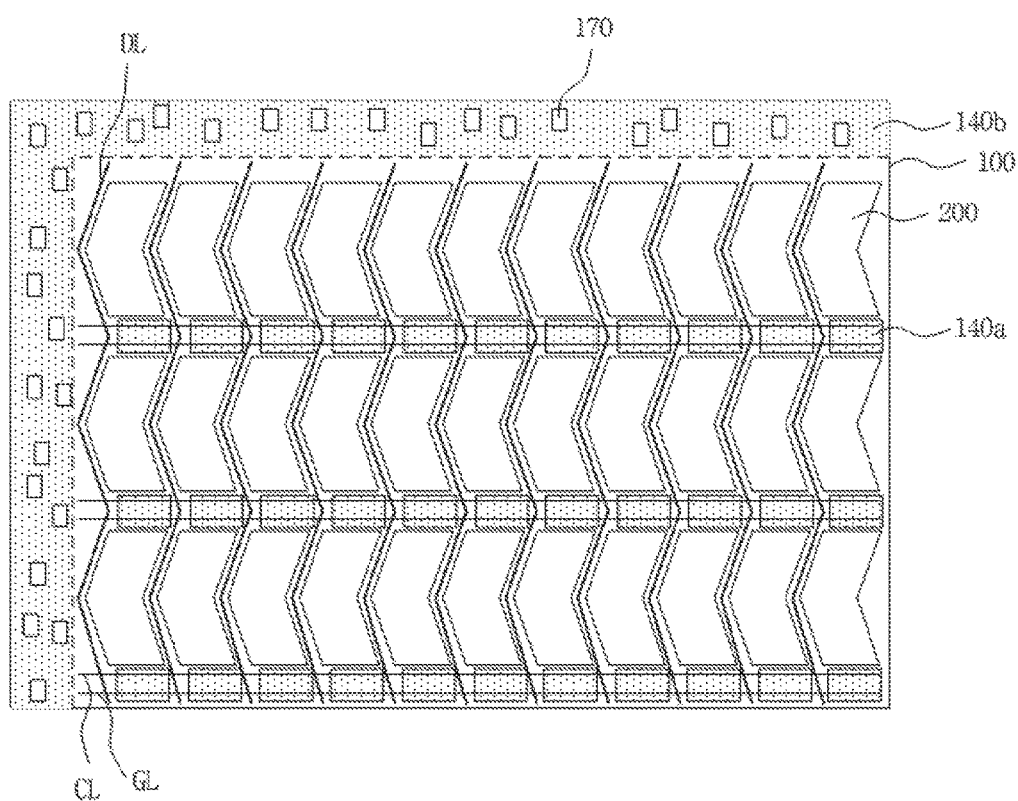
FIG. 1 is a plan view illustrating a thin film transistor array substrate according to an embodiment of the present invention.
Figure 2:
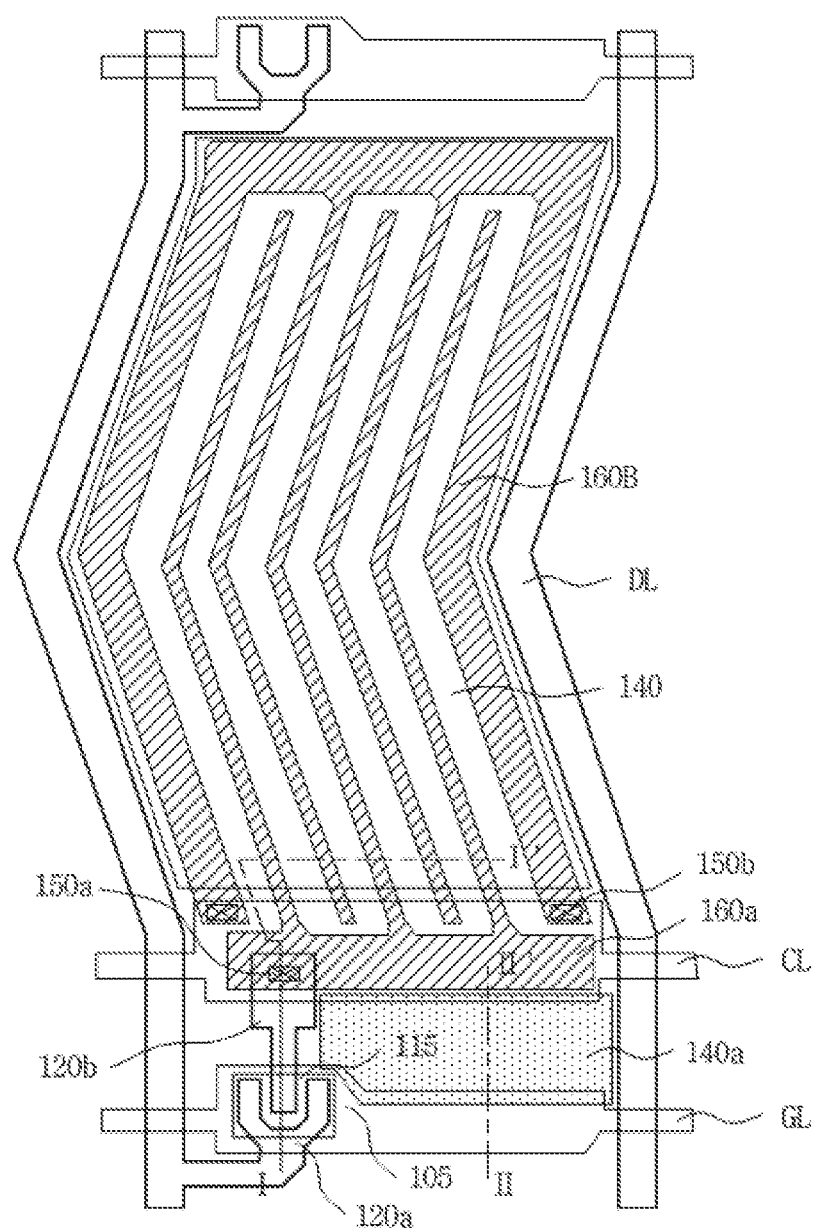
FIG. 2 is a plan view illustrating a pixel region of FIG. 1.
Figure 3A:
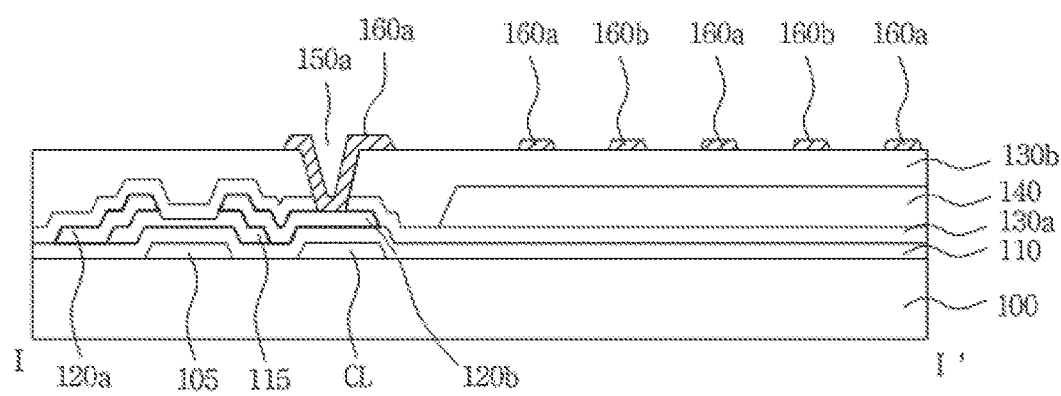
FIG. 3A is a cross-sectional view taken along I-I' of FIG. 2.
Figure 3B:
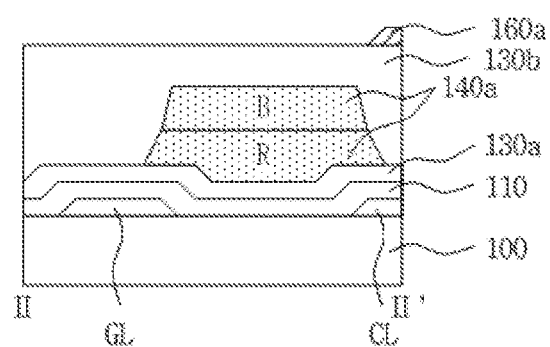
FIG. 3B is a cross-sectional view taken along II-II' of FIG. 2.
Figure 4A:
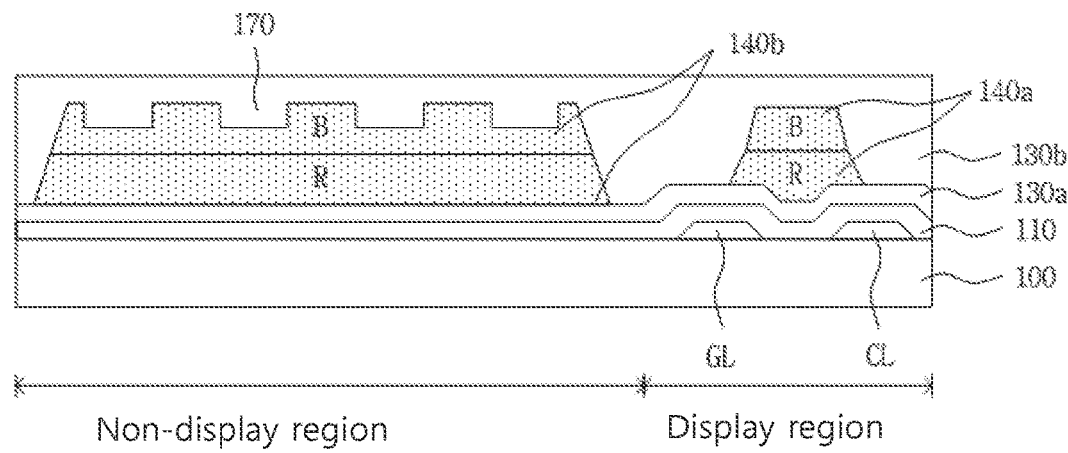
FIGS. 4A and 4B are cross-sectional views illustrating a display region and a non-display region according to an embodiment of the present invention.
Figure 4B:
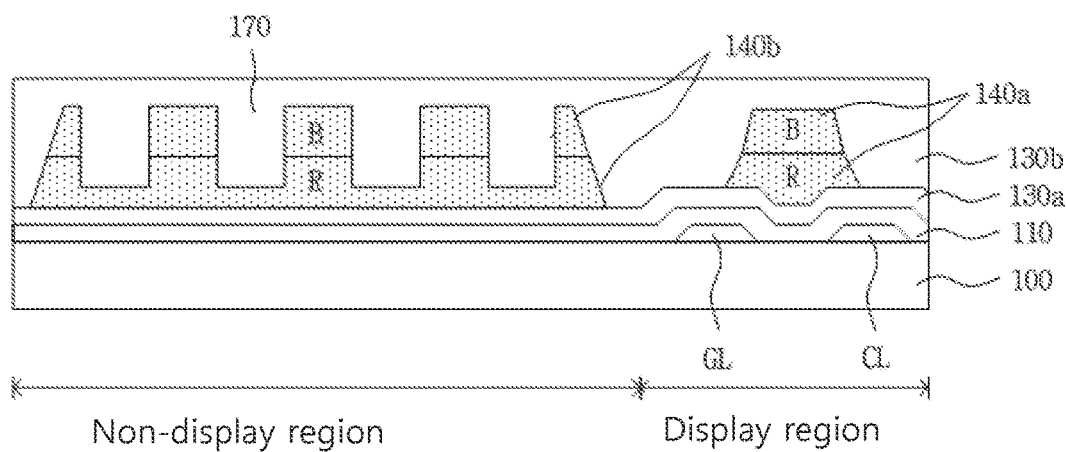

FIG. 1 is a plan view illustrating a thin film transistor array substrate according to an embodiment of the present invention and FIG. 2 is a plan view illustrating a pixel region of FIG. 1. In addition, FIG. 3A is a cross-sectional view taken along I-I' of FIG. 2 and FIG. 3B is a cross-sectional view taken along II-II' of FIG. 2. In addition, FIGS. 4A and 4B are cross-sectional views illustrating a display region and a non-display region according to an embodiment of the present invention.

As shown in FIG. 1, the thin film transistor array substrate according to an embodiment of the present invention includes a plurality of pixel regions 200 defined by a plurality of gate lines GL and a plurality of data lines DL which cross each other in a display region of a substrate 100. A thin film transistor is formed in each pixel region 200 and the thin film transistor is connected to a pixel electrode. In addition, common electrodes connected to common lines CL disposed parallel to the gate lines GL alternate with pixel electrodes to generate a transverse electric field. In particular, the thin film transistor array substrate according to one example of the present invention has a COT (color filter on TFT) structure in which red, green and blue color filters 140 are further formed in the respective pixel regions 200 on the substrate 100.

A first dummy color filter 140a is formed to overlap a gap between the gate line GL and the common line CL. The first dummy color filter 140a prevents leakage of light between the gate line GL and the common line CL parallel to each other, among light emitted from a backlight unit provided in the bottom of the thin film transistor array substrate.

In addition, although not shown, a light-shielding column spacer is formed on the color filter array substrate joined to the thin film transistor array substrate while facing the thin film transistor array substrate and thereby prevents light leakage, but the light-shielding column spacer cannot completely shield light leakage. Accordingly, the thin film transistor array substrate according to one example of the present invention also includes a second dummy color filter 140b in the non-display region of the substrate 100. The first and second dummy color filters 140a and 140b have a structure in which a red color filter and a blue color filter are stacked in this order and the second dummy color filter 140b is provided at the top thereof with at least one recess 170.

Specifically, as shown in FIGS. 2, 3A, 3B, 4A and 4B, the thin film transistor array substrate 100 includes a plurality of pixel regions 200 defined by a plurality of gate lines GL and a plurality of data lines DL which cross each other on the substrate 100. A thin film transistor is formed in each pixel region 200 and the thin film transistor is connected to pixel electrodes 160a. In addition, common electrodes 160b alternate with the pixel electrodes 160a to generate a transverse electric field therebetween.

In response to a scan signal supplied to the gate line GL, the thin film transistor enables a pixel signal supplied to the data line 125a to be filled and kept in the pixel electrode 160a. For this purpose, the thin film transistor includes a gate electrode 105, a gate insulation film 110, a semiconductor layer 115, a source electrode 120a and a drain electrode 120b.

The gate electrode 105 protrudes from the gate line GL or is defined as a portion of the gate line GL. In addition, the common line CL connected to the common electrode 160b is spaced from the gate line GL and is disposed parallel to the gate line GL.

The gate line GL, the gate electrode 105 and the common line CL may have a stack structure including two or more layers containing a metal material such as Al/Cr, Al/Mo, Al(Nd)/Al, Al(Nd)/Cr, Mo/Al(Nd)/Mo, Cu/Mo, Ti/Al(Nd)/Ti, Mo/Al, Mo/Ti/Al(Nd), Cu alloy/Mo, Cu alloy/Al, Cu alloy/Mo alloy, Cu alloy/Al alloy, Al/Mo alloy, Mo alloy/Al, Al alloy/Mo alloy, Mo alloy/Al alloy, or a Mo/Al alloy, or a structure including a single layer containing a metal material such as Mo, Ti, Cu, AlNd, Al, Cr, a Mo alloy, a Cu alloy or an Al alloy.

The semiconductor layer 115 overlaps the gate electrode 105 via the gate insulation film 110 and includes an active layer and an ohmic contact layer stacked in this order. The ohmic contact layer functions to reduce electrical contact resistance between the source and drain electrodes 120a and 120b, and the active layer, and the ohmic contact layer is selectively removed to expose the active layer and a region where the ohmic contact layer is removed is defined as a channel region.

The source electrode 120a is connected to the data line DL and receives a data signal of the data line DL. The drain electrode 120b faces the source electrode 120a via the channel region of the semiconductor layer 115 and supplies the data signal of the data line DL to the pixel electrode 160a.

In addition, a first protective film 130a is formed to cover the thin film transistor. The first protective film 130a is formed of an inorganic insulation material such as $SiN_x$ or $SiO_x$. Red, blue and green color filters 140 are respectively formed in the pixel regions on the first protective film 130a.

In addition, the first dummy color filter 140a is provided between adjacent pixel regions 200 on the first protective film 130a. The first dummy color filter 140a covers the gap between the gate line GL and the common line CL and the first dummy color filter 140a has a side overlapping the gate line GL and another side overlapping the common line CL. The first dummy color filter 140a prevents leakage of light between the gate line GL and the common line CL parallel to each other and has a structure in which a red color filter R and a blue color filter B are stacked in this order.

In particular, a second dummy color filter 140b is also provided in the non-display region. The second dummy color filter 140b prevents light leakage in the non-display region and has a structure in which a red color filter and a blue color filter are stacked in this order, like the first dummy color filter 140a.

The thin film transistor array substrate is joined to the color filter array substrate provided with the light-shielding column spacer such that the substrates cross each other. In this regard, the light-shielding column spacer cannot completely shield light emitted from the backlight unit and transmits purple light. Accordingly, as described above, the thin film transistor array substrate according to the present invention includes the first and second dummy color filters 140a and 140b having a structure in which a red color filter R and a blue color filter B are stacked in this order, thereby shielding purple light.

The second dummy color filter 140b is provided on the upper surface thereof with at least one recess 170. The recess 170 compensates for a step between the second protection film 130b disposed on the upper surface of the first dummy color filter 140a and the second protection film 130b disposed on the upper surface of the second dummy color filter 140b.

Specifically, a second protection film 130b is formed over the entire surface of the substrate 100 such that it covers the color filter 140, the first dummy color filter 140a and the second dummy color filter 140b. The second protection film 130b is formed of an organic insulation material, preferably, a photoactive compound (PAC).

In this regard, as described above, the first dummy color filter 140a prevents light leakage between adjacent pixel regions 200 and has a considerably small width. On the other hand, the second dummy color filter 140b is formed over the entire surface of the non-display region of the substrate 100 and thus has an upper surface wider than the upper surface of the first dummy color filter 140a. Accordingly, when the second protection film 130b is formed using an organic insulation material over the entire surface of the substrate 100, the organic insulation material flows into the first dummy color filter 140a having a small width before curing. Accordingly, the second protective film 130b, which is thinner than the upper surface of the second dummy color filter 140a, is formed on the first dummy color filter 140a, thus causing formation a step of the second protection film 130b and thus resulting in light leakage and stain of the display device and thus deterioration in quality.

However, the thin film transistor array substrate according to an embodiment of the present invention includes at least one recess 170 on the upper surface of the second dummy color filter 140b and the recess 170 is filled with an organic insulation material for forming the second protection film 130b. Accordingly, the organic insulation material compensates for the step of the second protection film 130b although flowing into the first dummy color filter 140a.

In this case, the recess 170 may be formed by selectively removing the blue color filter B, as shown in FIG. 4A, or removing the blue color filter B and the red color filter R, as shown in FIG. 4B. In particular, the recess 170 completely passes through the second dummy color filter 140a and has a shape selected from circular, oval and polygonal shapes.

The pixel electrode 160a is formed on the second protection film 130b. The pixel electrode 160a is connected to the drain electrode of the thin film transistor exposed by the drain contact hole 150a formed in the first and second protective film 130a and 30b. The pixel electrode 160a is formed of a transparent conductive material such as tin oxide (TO), indium tin oxide (ITO), indium zinc oxide (IZO) or indium tin zinc oxide (ITZO).

In addition, a common electrode 160b which alternates with the pixel electrode 160a to generate an electric field is further formed on the second protection film 130b. The common electrode 160b is connected to the common line CL through the common contact hole 150b which exposes the common line CL by selectively removing the gate insulation film 110 and the first and second protective film 130a and 30b.

That is, as described above, the thin film transistor array substrate according to the present invention includes the first dummy color filter 140a between adjacent pixel regions such that it overlaps the gate line GL and the common line CL and the second dummy color filter 140b is formed in the non-display region. In this case, the second dummy color filter 140b is provided on the upper surface thereof with at least one recess 170. The recess 170 compensates for a step of the second protection film 130b formed on the first and second dummy color filters 140a and 140b.

Hereinafter, a method for manufacturing the thin film transistor array substrate according to the present invention will be described in detail with reference to the annexed drawings.

FIGS. 5A to 5E are cross-sectional views illustrating a method for forming a display region of the thin film transistor array substrate according to an embodiment of the present invention and FIGS. 6A to 6E are cross-sectional views illustrating a method for forming a non-display region of the thin film transistor array substrate according to an embodiment of the present invention.

Figure 5A:
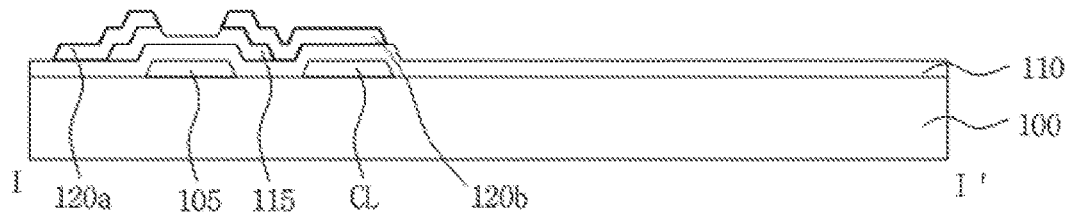
FIGS. 5A to 5E are cross-sectional views illustrating a method for forming the display region of the thin film transistor array substrate according to an embodiment of the present invention.
Figure 5A:
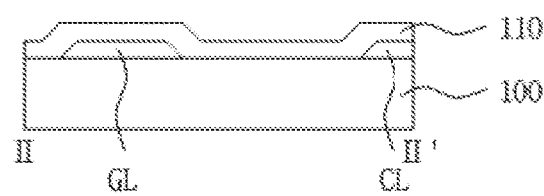
Figure 6A:
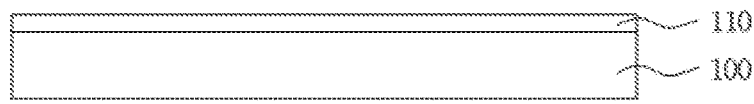
FIGS. 6A to 6E are cross-sectional views illustrating a method for forming the non-display region of the thin film transistor array substrate according to an embodiment of the present invention.

First, as shown in FIGS. 5A and 6A, a gate line GL and a common line CL are formed parallel to each other on the substrate 100, and a thin film transistor is formed in each pixel region defined by intersection of the gate line GL and a data line DL via a gate insulation film 110.

Specifically, a first metal layer is formed on the substrate 100 by deposition such as sputtering and is then patterned to form the gate line GL, a gate electrode 105 and the common line CL. In addition, a gate insulation film 110 is formed using a material such as silicon oxide ($SiO_x$) or silicon nitride ($SiN_x$) over the entire surface of the substrate 100 including the gate line GL, the gate electrode 105 and the common line CL.

Then, a semiconductor layer 115 having a structure in which an active layer and an ohmic contact layer are stacked in this order is formed on the gate insulation film 110 and a second metal layer is formed over the entire surface of the gate insulation film 110 including the semiconductor layer 115. In addition, the second metal layer is patterned to form source and drain electrodes 120a and 120b and the data line DL.

Figure 5B:
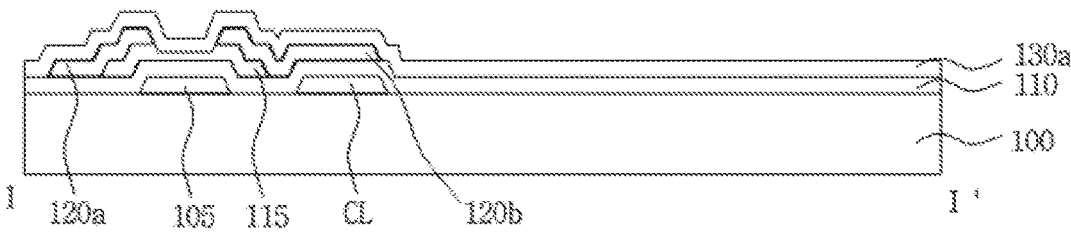
Figure 5B:
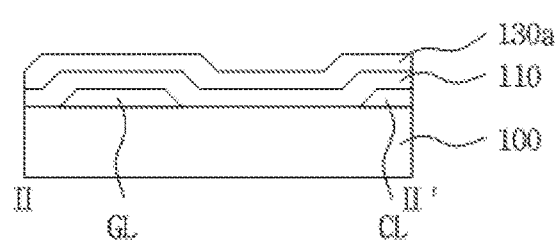
Figure 5C:
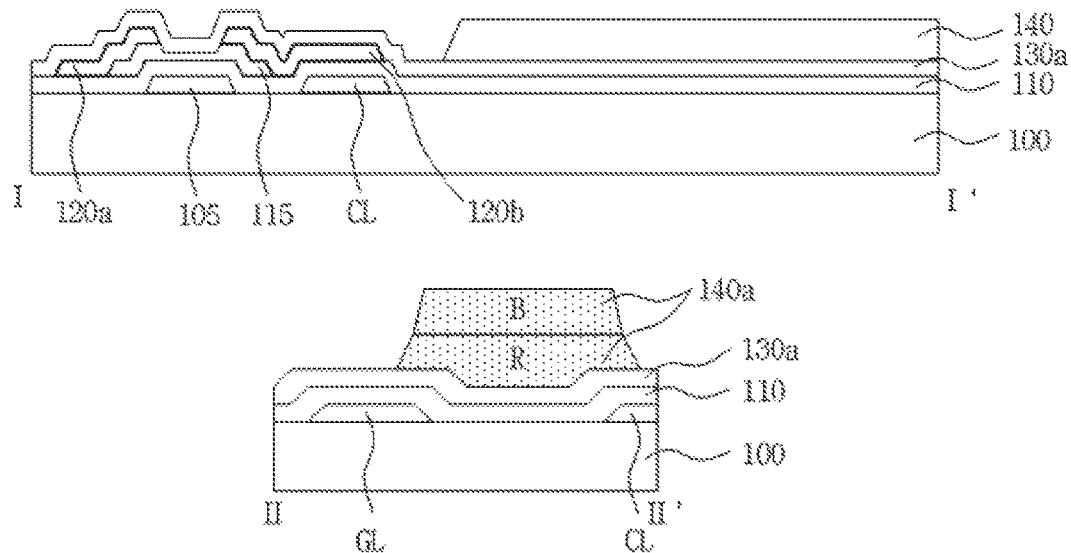
Figure 6B:
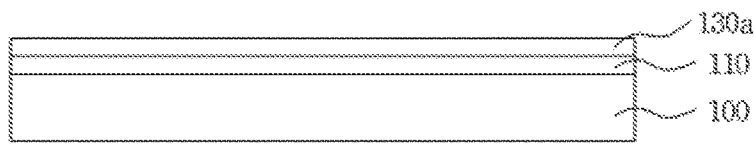
Figure 6C:
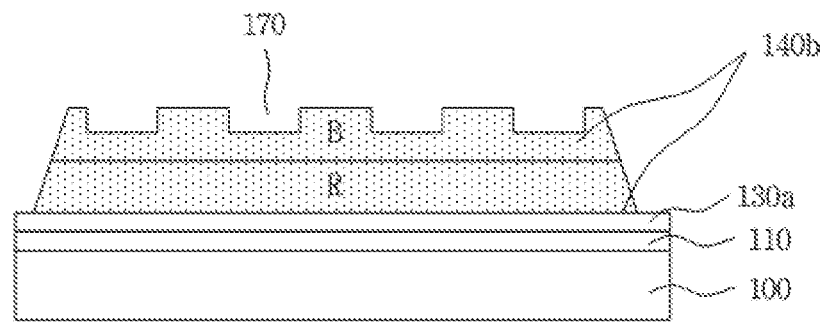

In addition, as shown in FIGS. 5B and 6B, a first protective film 130a is formed so as to cover the thin film transistor. The first protective film 130a is preferably formed of an inorganic insulation material such as SiNx or $SiO_x$. Then, as shown in FIGS. 5C and 6C, red, blue and green color filters 140 are respectively formed in pixel regions on the first protective film 130a.

A first dummy color filter 140a is formed between adjacent pixel regions such that it covers the gap between the gate line GL and the common line CL. The first dummy color filter 140a has a side overlapping the gate line GL and another side overlapping the common line CL. The first dummy color filter 140a has a structure in which a red color filter R and a blue color filter B are stacked in this order. The first dummy color filter 140a prevents light leakage in the gap between the gate line GL and the common line CL.

At the same time, a second dummy color filter 140b is also formed in the non-display region. The second dummy color filter 140b prevents light leakage in the non-display region and has a structure in which a red color filter and a blue color filter are stacked in this order, like the first dummy color filter 140a. The second dummy color filter 140b is provided with at least one recess 170 formed by selectively removing the blue color filter B or removing the blue color filter B and the red color filter R. The recess 170 has a shape selected from cylindrical, oval and polygonal shapes.

Figure 5D:
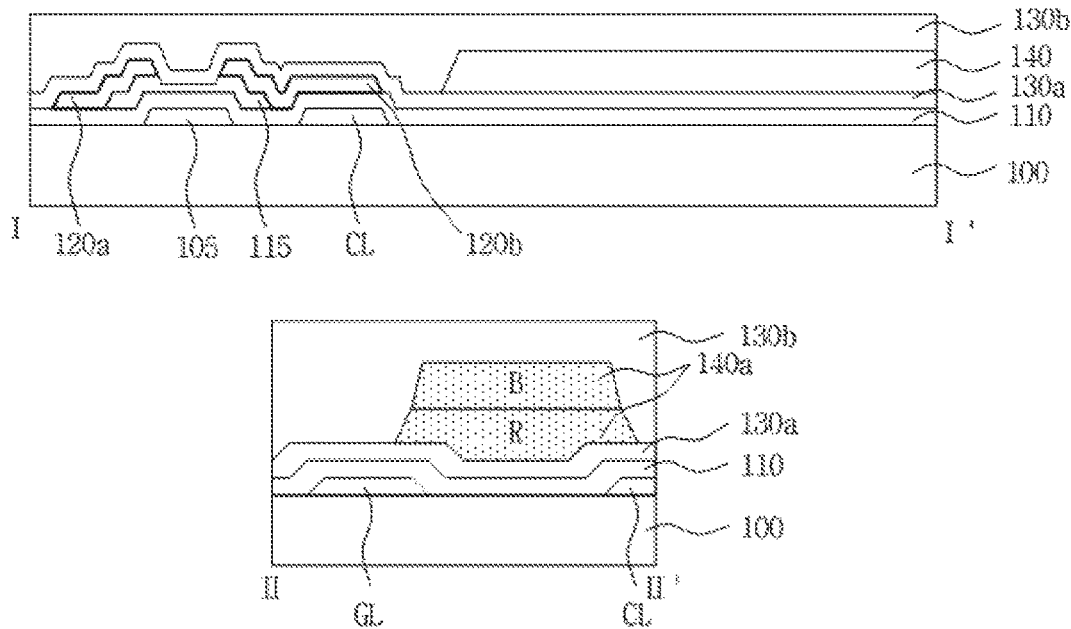
Figure 6D:
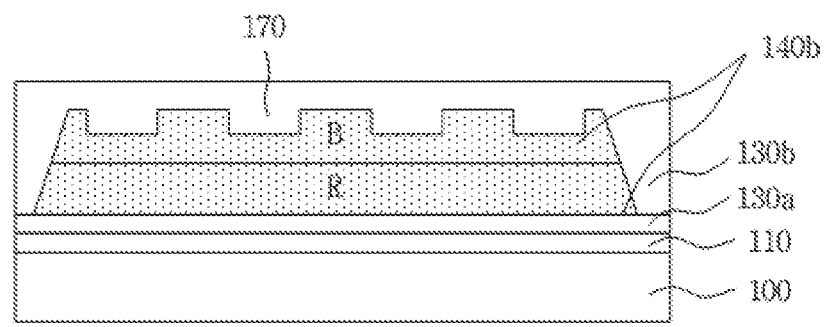

In addition, as shown in FIGS. 5D and 6D, a second protective film 130b is formed over the entire surface of the substrate 100 such that it covers the color filter 140, the first dummy color filter 140a and the second dummy color filter 140b. The second protection film 130b is formed of an organic insulation material, preferably, a photoactive compound (PAC). In this case, the recess 170 of the second dummy color filter 140b is filled with the organic insulation material.

Figure 5E:
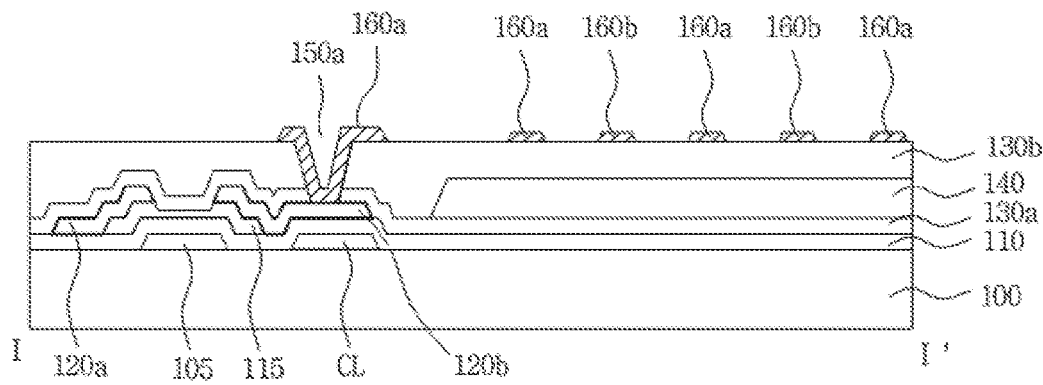
Figure 5E:
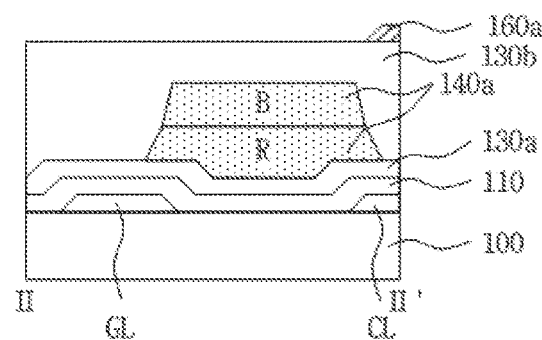
Figure 6E:
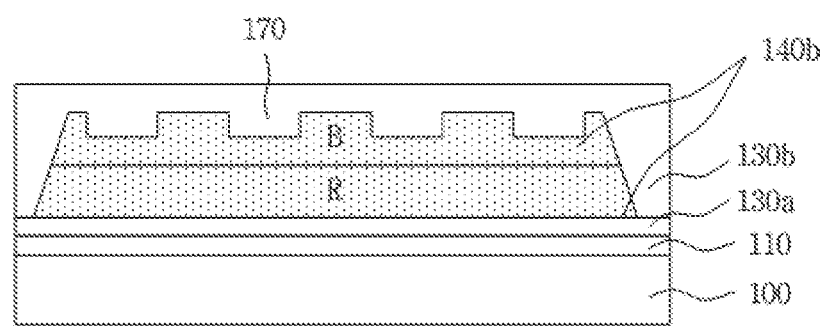

Then, as shown in FIGS. 5E and 6E, a pixel electrode 160a and a common electrode 160b are formed on the second protection film 130b. The pixel electrode 160a is connected to the drain electrode 120b of the thin film transistor exposed by the drain contact hole 150a formed in the first and second protective film 130a and 30b. The common electrode 160b is connected to the common line CL through the common contact hole 150b formed by selectively removing the gate insulation film 110 and the first and second protective film 130a and 30b.

The pixel electrode 160a and the common electrode 160b are formed of a transparent conductive material such as tin oxide (TO), indium tin oxide (ITO), indium zinc oxide (IZO) or indium tin zinc oxide (ITZO). In addition, the common electrode 160b alternates with the pixel electrode 160a to generate a transverse electric field.

The thin film transistor array substrate according to the present invention includes the first dummy color filter 140a formed between adjacent pixel regions such that it overlaps the gate line (GL) and the common line CL, and the second dummy color filter 140b is formed in the non-display region. In this case, the second dummy color filter 140b is provided on the upper surface thereof with at least one recess 170 and the recess 170 compensates for a step between the second protection film 130b disposed on the upper surface of the first dummy color filter 140a and the second protection film 130b disposed on the upper surface of the second protection film 130b.

As apparent from the foregoing, the method for manufacturing the thin film transistor array substrate and the method for manufacturing the same according to one or more embodiments of the present invention have the following advantages.

First, the first dummy color filter is formed between adjacent pixel regions such that it covers the gap between the gate line GL and the common line CL and a second dummy color filter is formed in a non-display region, thereby preventing light leakage.

Second, the second dummy color filter is provided with at least one recess 170 which is filled with a second protective film. Accordingly, it is possible to compensate for the step between the second protection film disposed on the upper surface of the first dummy color filter and the second protection film disposed on the upper surface of the second dummy color filter, thereby preventing stain of the display device and improving quality.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A thin film transistor array substrate comprising:
   a base substrate having a display region and a non-display region, wherein the non-display region is positioned at an outer region of the display region so as to surround the display region and is positioned at a periphery of the base substrate;
   a plurality of pixel regions positioned in the display region and defined by a plurality of gate lines and a plurality of data lines crossing each other,
   wherein each pixel region includes a thin film transistor and a color filter disposed on the thin film transistor;
   a common line arranged horizontally and disposed parallel and adjacent to a corresponding gate line;
   a first dummy color filter disposed on the common line and the corresponding gate line that are positioned between two vertically adjacent pixel regions in the display region;
   a second dummy color filter disposed in the non-display region positioned outside the plurality of pixel regions and at the periphery of the base substrate to surround the plurality of pixel regions, the second dummy color filter having a plurality of recesses provided on an upper surface of the second dummy color filter, wherein the second dummy color filter disposed in the non-display region is not disposed in the plurality of pixel regions and other regions in the display region; and
   a protective film disposed on the first and second dummy color filters and filling the plurality of recesses.

2. The thin film transistor array substrate according to claim 1, wherein the first and second dummy color filters have a structure in which a red color filter and a blue color filter are stacked in this order.

3. The thin film transistor array substrate according to claim 2, wherein the plurality of recesses are provided by selectively removing the blue color filter.

4. The thin film transistor array substrate according to claim 2, wherein the plurality of recesses are provided by selectively removing the blue color filter and the red color filter.

5. The thin film transistor array substrate according to claim 1, wherein the first dummy color filter overlaps the gate line and the common line.

6. The thin film transistor array substrate according to claim 1, wherein the plurality of recesses have a shape among circular, oval and polygonal shapes.

7. The thin film transistor array substrate according to claim 1, wherein the first dummy color filter fully covers an area between the common line and the corresponding gate line that are positioned between two vertically adjacent pixel regions in the display region.

8. The thin film transistor array substrate according to claim 1, wherein a width of the second dummy color filter is larger than a width of the first dummy color filter.

9. The thin film transistor array substrate according to claim 1, wherein at least a lower color filter of the second dummy color filter is fully disposed in the non-display region and spaced apart from the color filter and the first dummy color filter.

10. The thin film transistor array substrate according to claim 1, wherein the first and the second dummy color filters are thicker than the color filter.

11. A method for manufacturing a thin film transistor array substrate, the method comprising:
   forming a plurality of gate lines and a plurality of common lines parallel to each other in a display region on a base substrate, each common line being arranged horizontally and disposed parallel and adjacent to a corresponding gate line, wherein the non-display region is positioned at an outer region of the display region so as to surround the display region and is positioned at a periphery of the base substrate;
   forming a plurality of data lines crossing the gate lines to define a plurality of pixel regions and forming a thin film transistor and a color filter on the thin film transistor in each of the plurality of pixel regions, the plurality of pixel regions being positioned in the display region surrounded by the non-display region;
   forming a first dummy color filter disposed on the common line and the corresponding gate line that are positioned between two vertically adjacent pixel regions in the display region;

forming a second dummy color filter disposed in the non-display region positioned outside the plurality of pixel regions and at the periphery of the base substrate to surround the plurality of pixel regions, the second dummy color filter having a plurality of recesses provided on an upper surface of the second dummy color filter, wherein the second dummy color filter disposed in the non-display region is not disposed in the plurality of pixel regions and other regions in the display region; and forming a protective film over an entire surface of the base substrate to cover the first and second dummy color filters and fill the plurality of recesses.

12. The method according to claim 11, wherein the forming the first dummy color filter is performed by stacking a red color filter and a blue color filter in this order.

13. The method according to claim 12, wherein the forming the second dummy color filter is performed by stacking the red color filter and the blue color filter in this order, and then selectively removing the blue color filter.

14. The method according to claim 12, wherein the forming the second dummy color filter is performed by stacking the red color filter and the blue color filter in this order, and then selectively removing the blue color filter and the red color filter.

15. The method according to claim 11, wherein the forming the first dummy color filter is performed by covering a horizontal gap between the gate line and the common line and overlapping the gate line and the common line.

16. A thin film transistor array substrate comprising:

a base substrate having a display region and a non-display region, wherein the non-display region is positioned at an outer region of the display region so as to surround the display region and is positioned at a periphery of the base substrate;

a plurality of pixel regions positioned in the display region and defined by a plurality of gate lines crossing a plurality of data lines, each pixel region being positioned in the display region of the base substrate, wherein each pixel region includes a thin film transistor and a color filter disposed on the thin film transistor; and a dummy color filter disposed in the non-display region positioned outside the plurality of pixel regions in the display region and at the periphery of the base substrate to surround the plurality of pixel regions, the dummy color filter having a structure in which a first color filter and a second color filter are stacked in this order, wherein an upper surface of the second color filter of the dummy color filter has a plurality of recesses, and wherein the dummy color filter disposed in the non-display region is not disposed in the plurality of pixel regions and other regions in the display region.

* * * * *